(12) United States Patent
Lee et al.

(10) Patent No.: US 7,745,907 B2
(45) Date of Patent: Jun. 29, 2010

(54) SEMICONDUCTOR PACKAGE INCLUDING CONNECTOR DISPOSED IN TROUGHHOLE

(75) Inventors: Jong-Ho Lee, Chungcheongnam-do (KR); Young-Lyong Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 77 days.

(21) Appl. No.: 11/764,072

(22) Filed: Jun. 15, 2007

(65) Prior Publication Data
US 2007/0296067 A1    Dec. 27, 2007

(30) Foreign Application Priority Data
Jun. 22, 2006    (KR) ............... 10-2006-0056550

(51) Int. Cl.
*H01L 29/40* (2006.01)
(52) U.S. Cl. ............ 257/621; 257/684; 257/737; 257/E23.01
(58) Field of Classification Search .......... 257/621, 257/684, 698, 737, 774, E23.01
See application file for complete search history.

(56) References Cited

U.S. PATENT DOCUMENTS 6,013,948 A * 1/2000 Akram et al. ............ 257/698
7,453,141 B2 * 11/2008 Miyagawa et al. .......... 257/678

FOREIGN PATENT DOCUMENTS

| KR | 2001-0061784 | 7/2001 |
|---|---|---|
| KR | 2002-0001427 | 1/2002 |
| KR | 2002-0028020 | 4/2002 |

OTHER PUBLICATIONS

English language abstract of Japanese Publication No. 2001-0061784.
English language abstract of Japanese Publication No. 2002-0001427.
English language abstract of Japanese Publication No. 2002-0028020.

* cited by examiner

*Primary Examiner*—Hoai v Pham
(74) *Attorney, Agent, or Firm*—Volentine & Whitt, PLLC (57) ABSTRACT

A semiconductor package and a method of fabricating the same are provided. The semiconductor package includes a semiconductor chip and a circuit board. The semiconductor chip has a bond pad. The circuit board has a base substrate with a throughhole, and a conductive film pattern placed on a sidewall of the throughhole. The throughhole is aligned with the bond pad to expose the bond pad. A connector located within the throughhole electrically connects the conductive film pattern to the bond pad. A sealing layer covers the connector.

7 Claims, 8 Drawing Sheets

SEMICONDUCTOR PACKAGE INCLUDING CONNECTOR DISPOSED IN TROUGHHOLE

CROSS-REFERENCE TO RELATED PATENT APPLICATION

This application claims priority under 35 USC §119 to Korean Patent Application No. 10-2006-0056550, filed on Jun. 22, 2006, in the Korean Intellectual Property Office, the disclosure of which is incorporated herein in its entirety by reference.

BACKGROUND

1. Technical Field

The present invention relates to a semiconductor package and a method of fabricating the same, and more particularly to a ball grid array (BGA) semiconductor package and a method of fabricating the same.

2. Description of the Related Art

The persistent demand for miniaturization of semiconductor products requires light, thin and small semiconductor packages as well as high integration of semiconductor chips. To meet these demands, solder ball packages such as ball grid arrays (BGAs), using solder balls as mounting units, have been developed. BGA packages include a typical BGA package, a board on chip (BoC) package and a flip chip package.

The typical BGA package has a semiconductor chip mounted on a circuit board (CB). Generally, bond pads of the semiconductor chip are electrically connected to bond fingers on the circuit board by metal wires. In the BGA package, the bond fingers may be located on the periphery of the region where the semiconductor chip is placed. Therefore, dimensional shrinkage of the circuit board and the resulting package dimension shrinkage are limited. Moreover, the metal wires are usually formed of gold, which increases the package fabrication cost.

The BoC package includes a circuit board having a window, and bond pads exposed within the window. The circuit board has bond fingers on the surface opposite that which contacts the semiconductor chip. The bond pads and the bond fingers are electrically connected to each other by metal wires. However, the window must be sufficiently wide to allow the operation of a capillary of a metal-wire bonding system used for forming the metal wire. Accordingly, the dimensional shrinkage of the circuit board and the resulting package dimension shrinkage may be limited due to the size of the window. Furthermore, similar to the typical BGA package, the metal wires are usually composed of gold, which increases the package fabrication cost.

To fabricate the flip chip package, metal projections are formed on bond pads of a semiconductor chip. Then, the semiconductor chip with the metal projections is turned upside down and bonded to a circuit board. However, the fabrication of the flip chip package has the drawback of being performed at a high temperature.

Consequently, a BGA package having reduced size and cost is desired to address these and other disadvantages of the conventional BGA packages.

SUMMARY

This disclosure provides a highly minimized semiconductor package which can be fabricated cheaply. This disclosure also provides a method of cheaply fabricating a highly minimized semiconductor package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals denote like elements in the drawings.

First Embodiment

FIGS. 1A through 1E are sectional views illustrating a method of fabricating a semiconductor package according to an embodiment of the present invention.

Figure 1A:
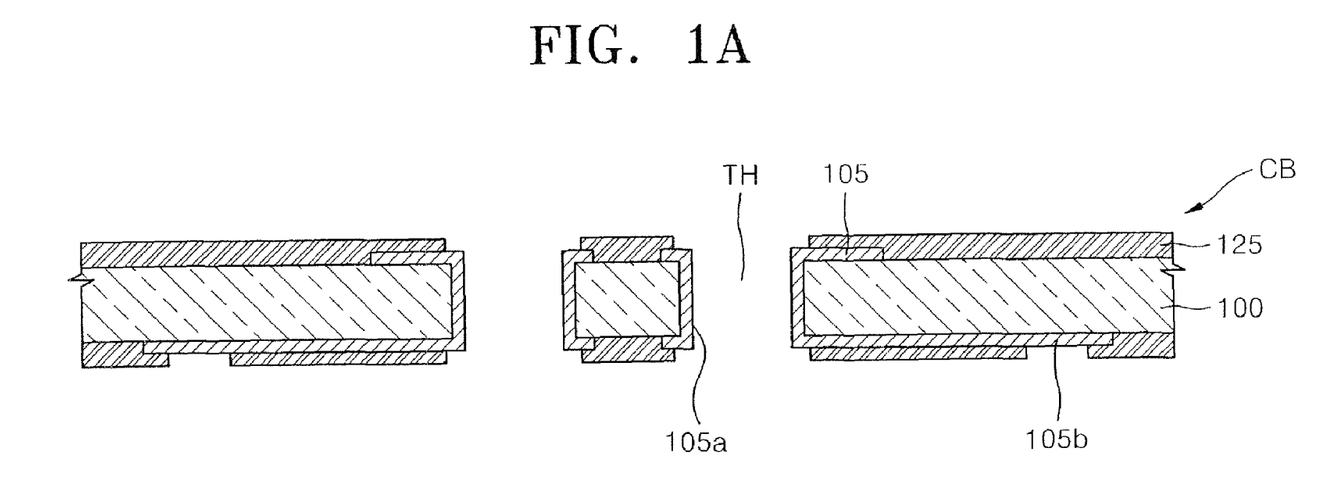
FIGS. 1A through 1E are sectional views illustrating a method of fabricating a semiconductor package according to an embodiment of the present invention.

Referring to FIG. 1A, a circuit board CB has a throughhole TH penetrating through a base substrate 100. The throughhole TH is formed to correspond to the location and number of bond pads of a semiconductor chip that will be described below. In this case, the base substrate 100 may be a plated substrate covered with plated films (not shown) that are stacked on both sides thereof. A conductive layer is stacked on upper and lower surfaces of the base substrate 100 and sidewalls within the throughholes TH. The conductive layer may be applied by plating.

After a photoresist pattern (not shown) is formed on the conductive layer by photolithography, the conductive layer is etched using the photoresist pattern as a mask, to form a conductive layer pattern 105. The conductive layer pattern 105 is located on the sidewall of the throughhole TH, and extends onto the upper and lower surfaces of the base substrate 100. The conductive layer pattern 105 may cover the sidewall of the throughhole TH.

A portion of the conductive layer pattern 105 extending onto the lower surface of the base substrate 100 may be a solder ball land region 105$b$ to which is bonded a solder ball that will be described below. Also, a portion located on the sidewall of the throughhole TH may be a path region 105$a$ that transfers an electrical signal from a semiconductor chip that will be described below to the solder ball land region 105$b$. The other portions of the conductive layer pattern 105 may form a circuit pattern.

Figure 1B:
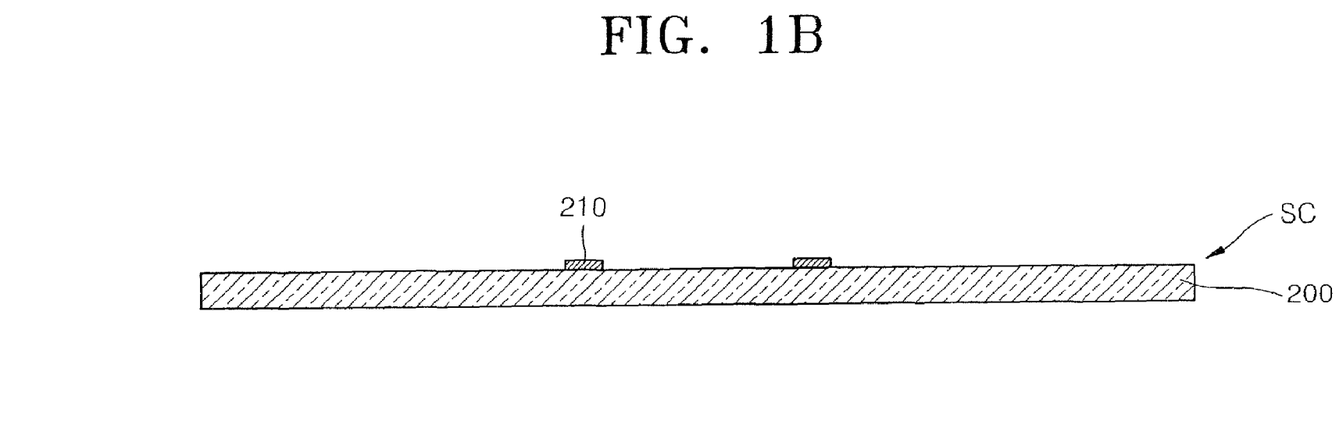

A solder ball mask 125 is formed on the upper and lower surfaces of the base substrate 100 where the conductive layer pattern 105 is formed. The solder ball mask 125 includes openings which expose the solder ball land region 105*b*. Even after the solder ball mask 125 is formed, the path region 105*a* is exposed on the sidewall of the throughhole TH. Referring to FIG. 1B, a semiconductor chip SC has a bond pad 210 formed on a semiconductor substrate 200. The semiconductor chip SC may be a center pad type in which the bond pad 210 is formed near or at the center of the semiconductor chip SC as illustrated in FIG. 1B.

Figure 1C:
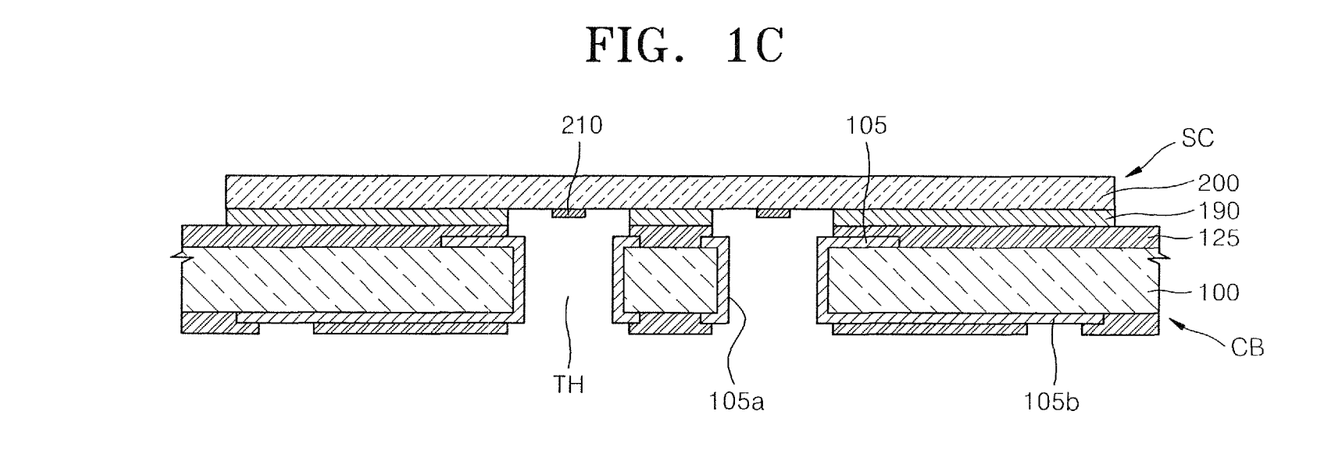

Referring to FIG. 1C, an adhesive film 190 is formed on the solder mask 125 on the upper surface of the circuit board CB. The adhesive layer 190 may be formed by printing or dispensing.

Then, the semiconductor chip SC is flipped and placed onto the adhesive layer 190. The throughole TH is aligned with the bond pad 210 so that the bond pad 210 is exposed within the throughhole TH.

Thereafter, the circuit board CB is adhered to the semiconductor chip SC by curing the adhesive layer 190.

Figure 1D:
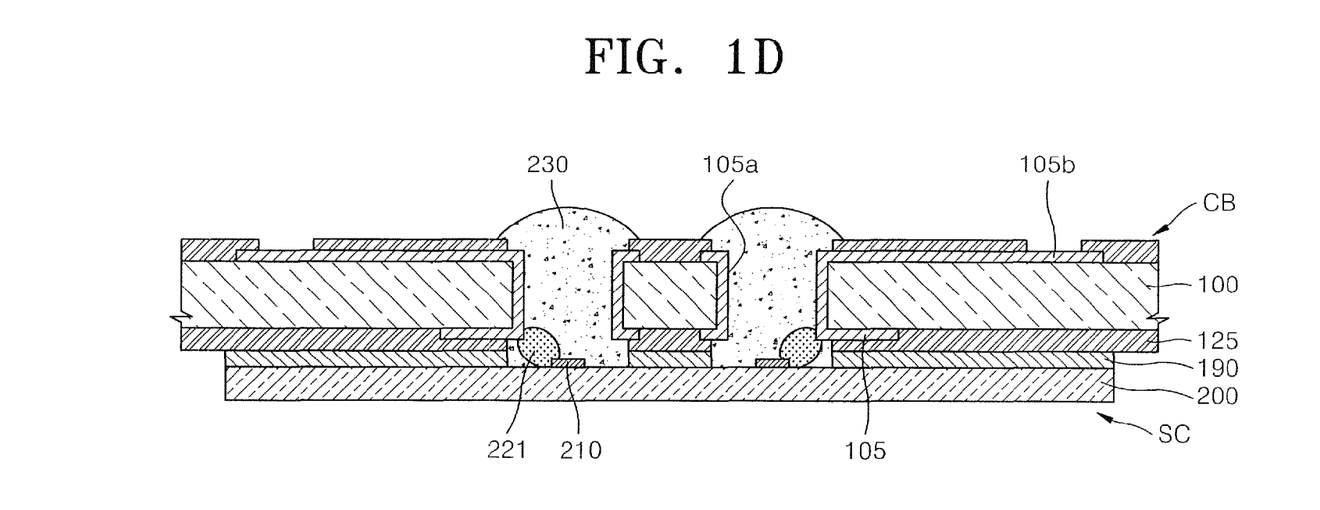

Referring to FIG. 1D, the resultant structure having the circuit board CB and the semiconductor chip SC is turned upside down, and a connector 221 is formed to electrically connect the path region 105*a* of the conductive layer pattern 105 exposed within the throughhole TH to the bond pad 210.

The connector 221 may be placed between the path region 105*a* of the conductive layer pattern 105 on the lower sidewall of the throughhole TH and the bond pad 210. The connector 221 may be a conductive particle 221. In this case, the conductive particle 221 is located on the lower portion of the throughhole TH.

The conductive particle 221 may be particles included in conductive adhesive or conductive powder. In more detail, the conductive particles may be solder, silver, nickel, lead or an alloy of these materials, and the conductive adhesive may be silver epoxy. The conductive particles 221 may be formed by jetting.

Subsequently, a sealing layer 230 is formed to cover the connector 221. The sealing layer 230 may be formed by printing.

Figure 1E:
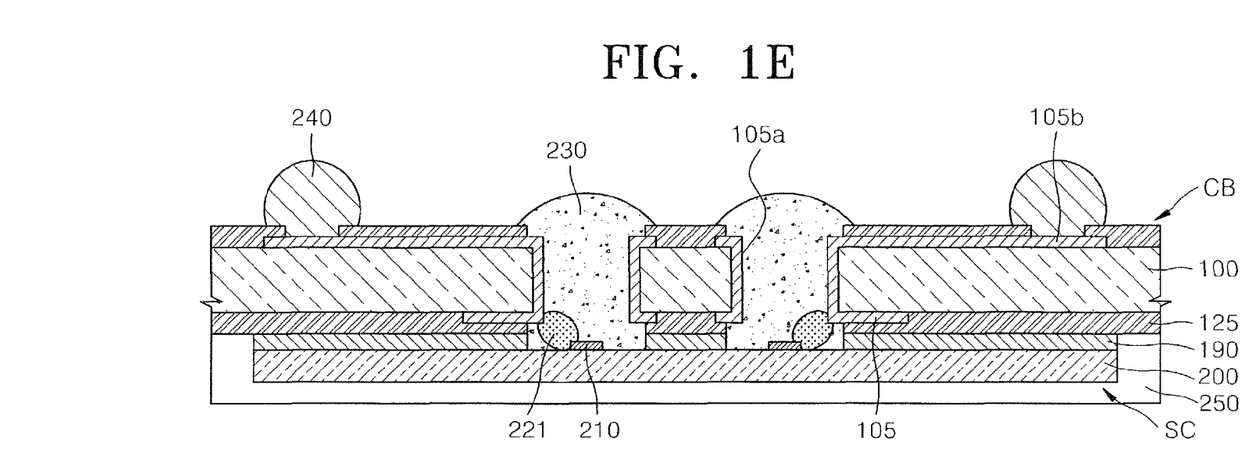

Referring to FIG. 1E, a molding member 250 is formed to encase the semiconductor chip SC. The molding member 250 may include epoxy resin.

A solder ball 240 is formed on the solder ball land region 105*b* exposed on the upper surface of the circuit board CB. The solder ball 240 is placed on the solder ball land region 105*b* and attached to the solder ball land region 105*b* by reflow. This completes the semiconductor package.

As described above, the bond pad 210 of the semiconductor chip SC can be electrically connected to the solder ball 240 sequentially via the connector 221, the path region 105*a* within the throughhole TH and the solder ball land region 105*b*. In this case, the path region 105*a* acts similarly to a bond finger in a typical BGA package and a Board on Chip (BoC) package. Also, the connector 221 may act as a gold wire in the typical BGA package and BoC package. Because the path region 105*a* is formed on the sidewall of the throughole TH, no additional regions such as the bond finger of the typical BGA package are required on the circuit board CB. Furthermore, the distance between the path region 105*a* and the bond pad 210 is relatively small, and thus no gold wire is needed and the window size is not limited as in the BoC package. Therefore, the circuit board CB dimensions can be greatly decreased, which in turn minimizes the package size. The lack of gold wire reduces the fabrication cost. Also, high temperature processing performed for the flip-chip package is not required when fabricating the semiconductor package according to this embodiment.

Moreover, the sealing layer 230 shields the connector 221 from physical impact, humidity and electrical interference.

Second Embodiment

Figure 2:
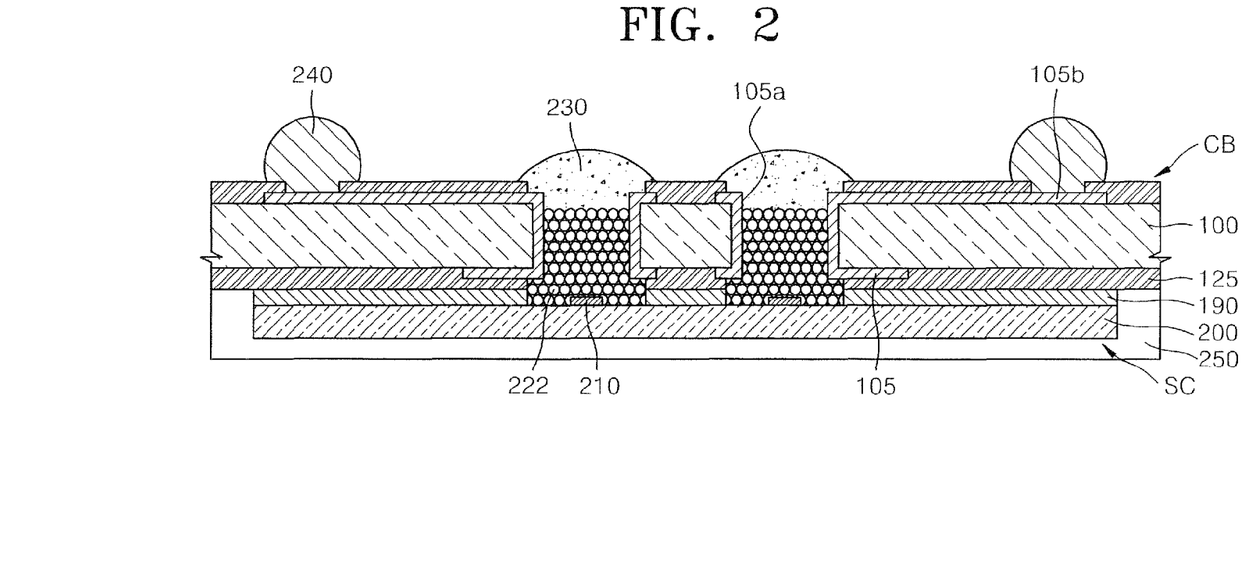
FIG. 2 is a sectional view illustrating a method of fabricating a semiconductor package according to a second embodiment of the present invention.

FIG. 2 is a sectional view illustrating a method of fabricating a semiconductor package according to a second embodiment of the present invention. A semiconductor package according to this embodiment is similar to that described with reference to FIGS. 1A through 1E except for the following.

Referring to FIG. 2, a semiconductor chip SC is bonded to a circuit board CB fabricated according to the method described with reference to FIGS. 1A through 1C.

Then, connectors 222 are formed to electrically connect a path region 105*a* of a conductive layer pattern 105 exposed within a throughole TH. The connectors 222 may be a plurality of conductive particles. The plurality of conductive particles may be filled into the throughole TH. The conductive particles may be included in a conductive adhesive or conductive powder. The conductive particles may be composed of solder, silver, nickel, lead or an alloy of these materials, and the conductive adhesive may be silver epoxy. The conductive particles may be formed by printing or jetting.

Subsequently, a sealing layer 230 is formed to cover the connectors 222. Thus, the connectors 222 are shielded by the sealing layer 230 from physical impact, humidity, electrical interference, etc.

As described with reference to FIG. 1E, a molding member 250 and a solder ball 240 are formed, thereby completing a semiconductor package.

Third Embodiment

FIGS. 3A through 3E are sectional views illustrating a method of fabricating a semiconductor package according to a third embodiment of the present invention. This method is similar to that described with reference to FIGS. 1A through 1E except for the following.

Figure 3A:
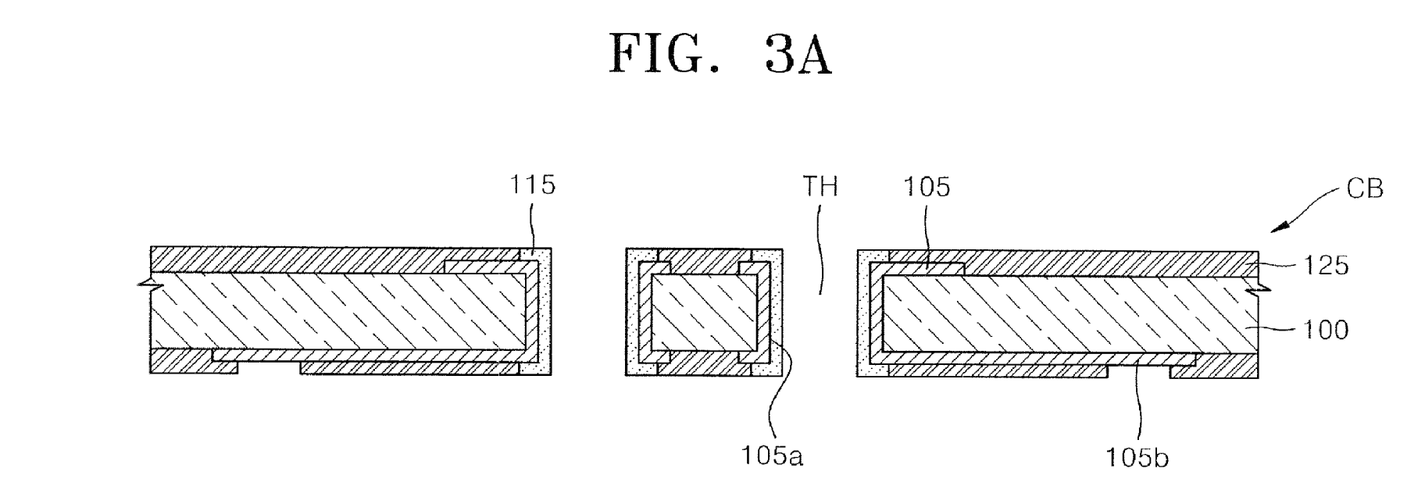
FIGS. 3A through 3E are sectional views illustrating a method of fabricating a semiconductor package according to a third embodiment of the present invention.

Referring to FIG. 3A, a low melting point metal film 115 is formed on a conductive film pattern 105 i.e., a path region 105*a* of a conductive layer pattern 105 exposed within a throughole TH. The low melting point metal film 115 has a lower melting point than a bond pad 210 of FIG. 3B and conductive layer pattern 105, and may be a solder film. The low melting point metal film 115 may be formed by plating or jetting.

Figure 3B:
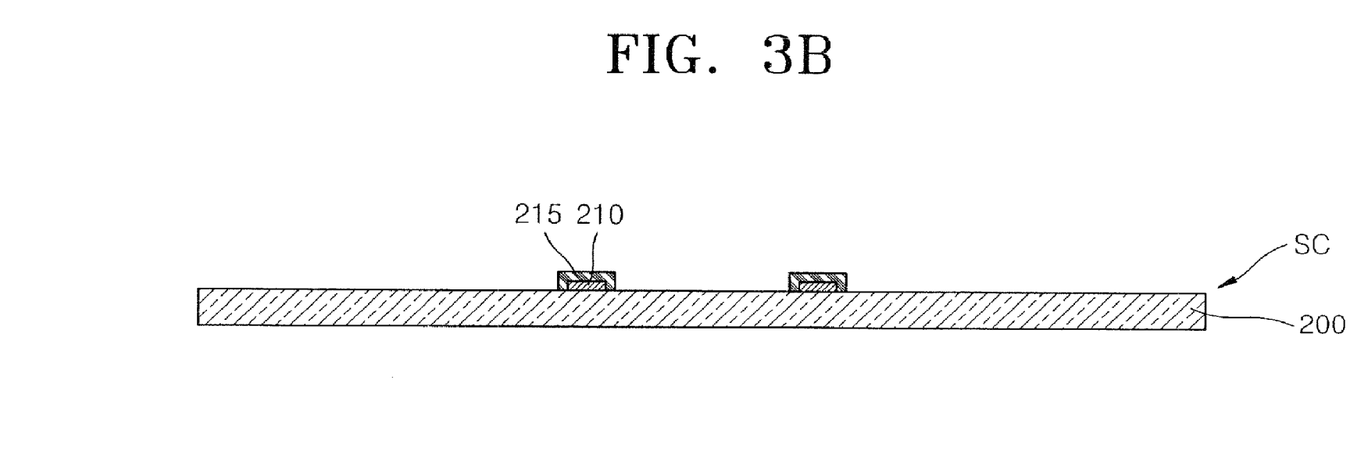

Referring to FIG. 3B, a reactive metal film 215 may be formed on a bond pad 210. The reactive metal film 215 easily reacts with the low melting point metal film 115, and may be formed of gold or an alloy of gold and nickel. The reactive metal film 215 may be formed by plating or jetting.

Figure 3C:
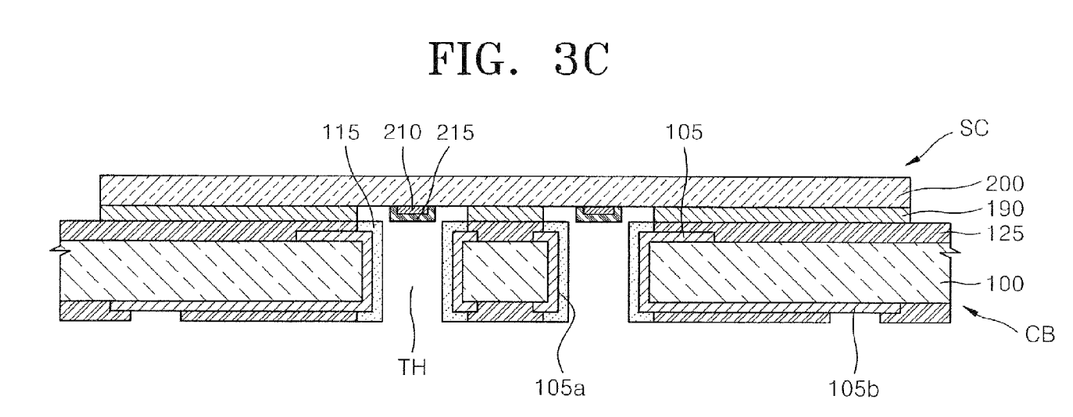

Referring to FIG. 3C, a circuit board CB with the low melting point metal film 115 is adhered to the semiconductor chip SC with the reactive metal film 215 by an adhesive layer 190.

Figure 3D:
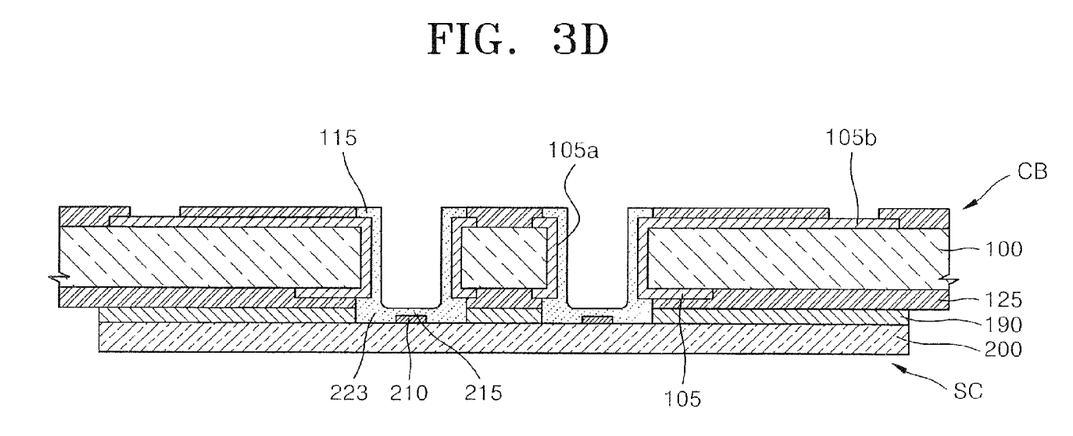

Referring to FIG. 3D, the structure having the circuit board CB and the semiconductor chip SC is thermally treated to reflow the low melting point metal film 115. The renown low melting point metal film 115 may react with the reactive metal film 215 to form a metallic bond. As a result, a connector 223 connecting the bond pad 210 to a path region 105*a* is formed between the low melting point metal layer 115 and the reactive metal layer 215. Since the connector 223 is formed by a metallic bond, an excellent electrical connection is made between the bond pad 210 and the path region 105*a*.

Subsequently, a sealing layer 230 is formed to cover the connector 223. Thus, the connector 223 is shielded by the sealing layer 230 from physical impact, humidity, electrical interference and so on.

Figure 3E:
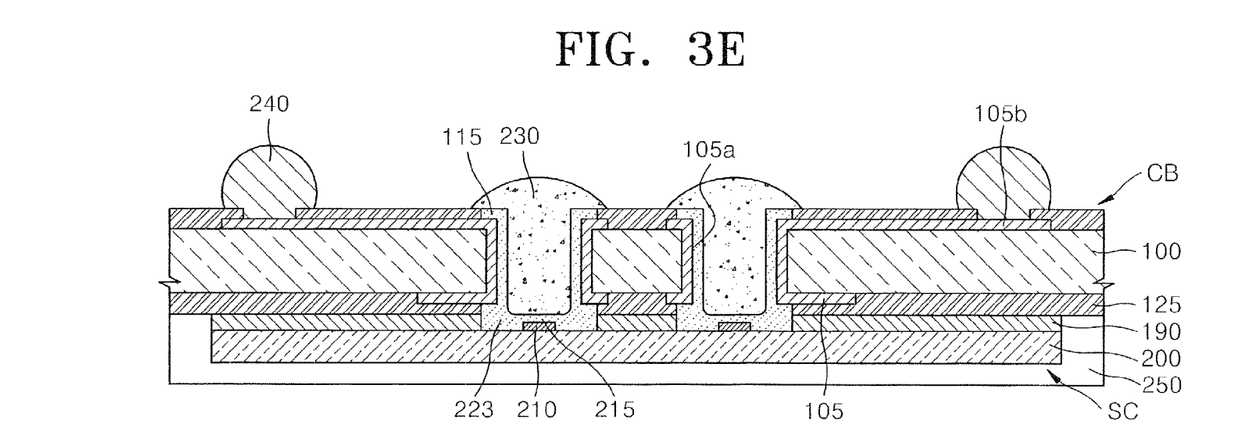

Referring to FIG. 3E, as described with reference to FIG. 1E, a molding member 250 and a solder ball 240 are formed to complete the semiconductor package.

According to this embodiment, the low melting point metal film 115 is formed on the path region 105a of the conductive film pattern 105, and the reactive metal film 215 is formed on the bond pad 210, but the present invention is not limited thereto. The low melting point metal film 115 may be formed on the bond pad 210, and the reactive metal film 215 may be formed on the path region 105a of the conductive film pattern 105. Also, the reactive metal layer 215 may not be formed. In this case, the connector 223 is formed between the reflown low melting point metal film 115 and the bond pad 210, to electrically connect the path region 105a to the bond pad 210.

Fourth Embodiment

FIGS. 4A through 4E are sectional views illustrating a method of fabricating a semiconductor package according to a fourth embodiment of the present invention. This method is similar to that described with reference to FIGS. 1A through 1E except for the following.

Figure 4A:
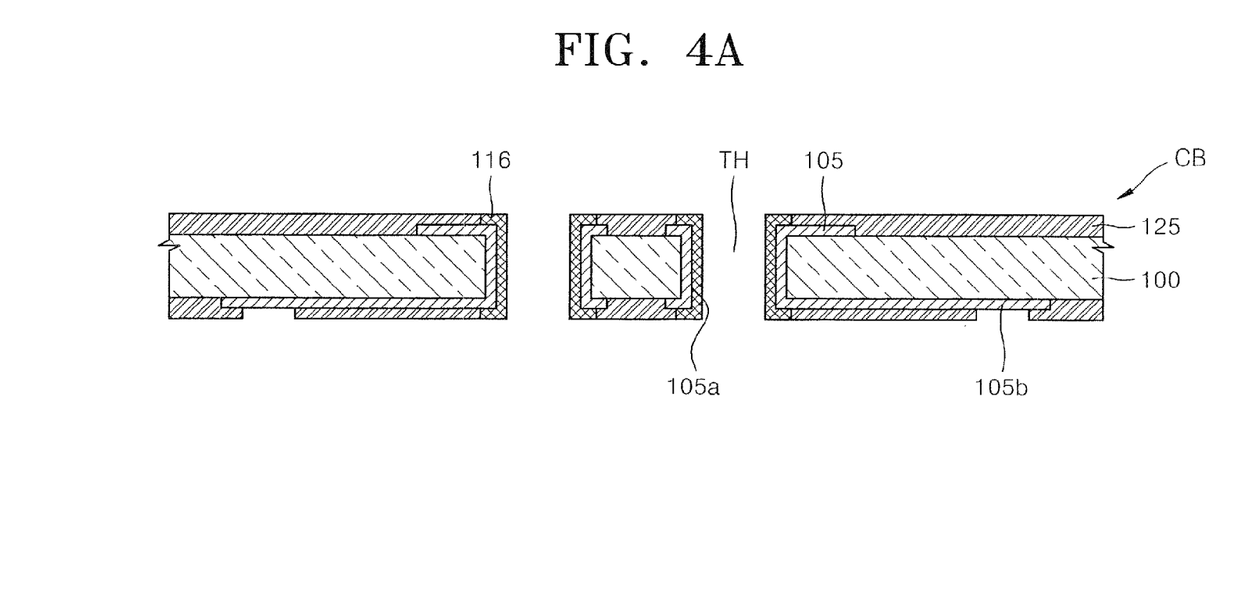
FIGS. 4A through 4E are sectional views illustrating a method of fabricating a semiconductor package according to a fourth embodiment of the present invention.

Referring to FIG. 4A, a first seed metal layer 116 is formed on a path region 105a of a conductive film pattern 105 exposed within a throughole TH.

Figure 4B:
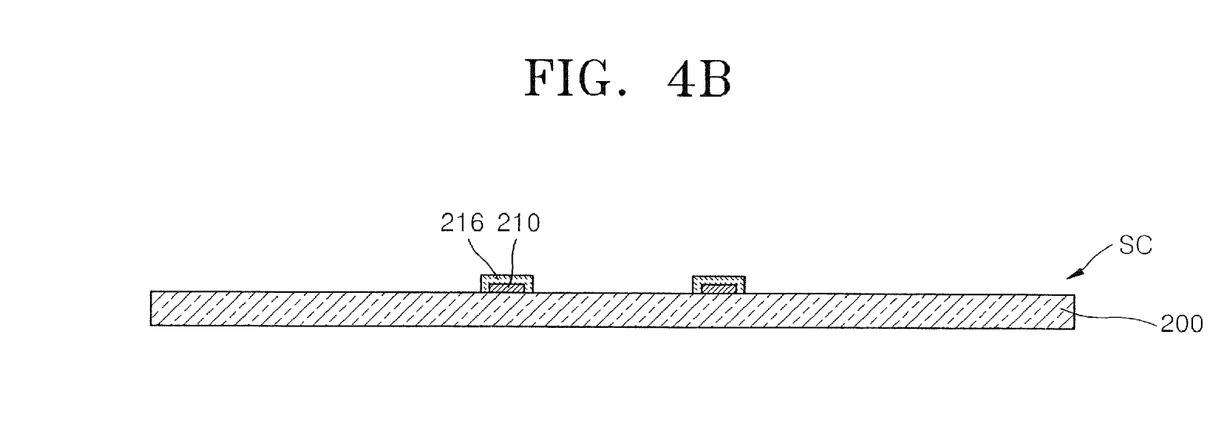

Referring to FIG. 4B, a second seed metal layer 216 is formed on a bond pad 210. The first and second seed metal layers 116 and 216 may be composed of a nickel film, a lead film or a zinc film, independently of each other or in combination.

Figure 4C:
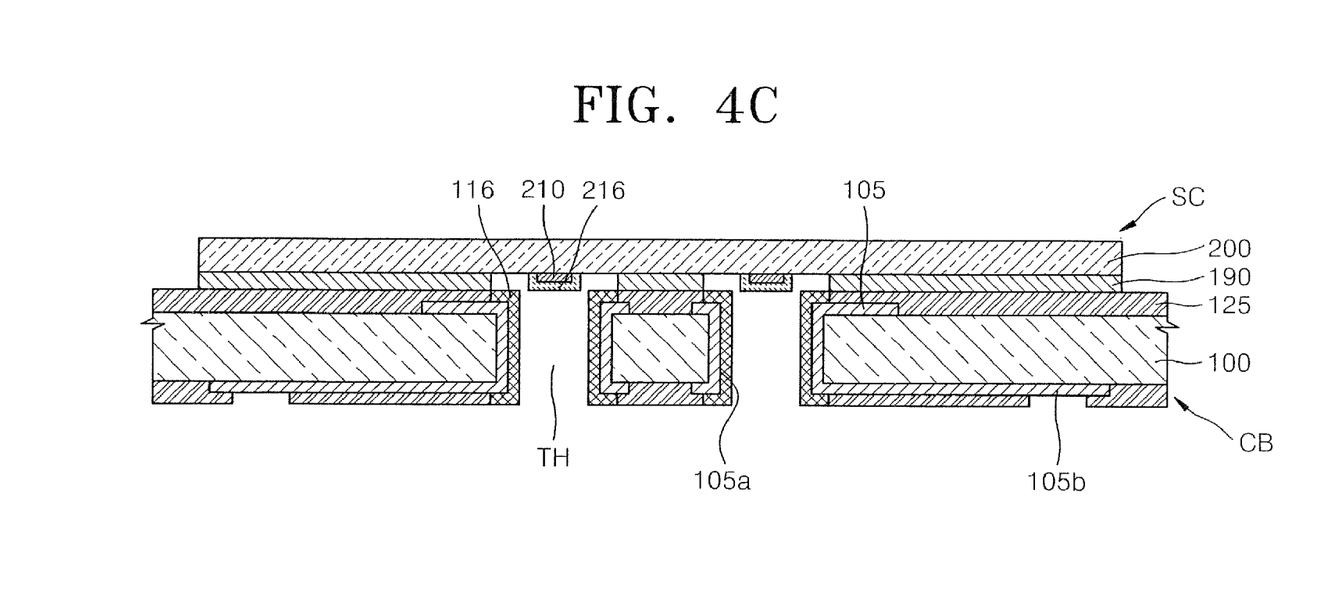

Referring to FIG. 4C, a circuit board CB with the first seed metal layer 116 is adhered to a semiconductor chip SC with the second seed metal layer 216 by an adhesive layer 190.

Figure 4D:
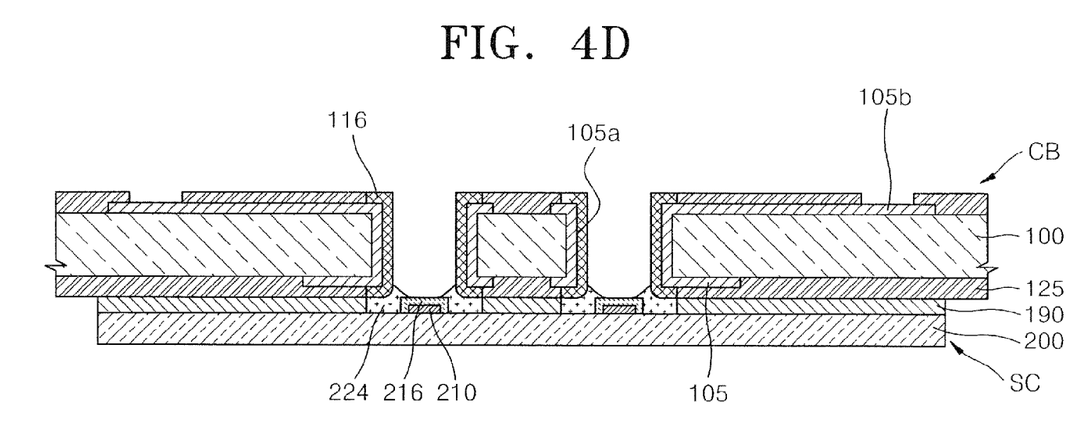

Referring to FIG. 4D, the structure having the circuit board CB and the semiconductor chip SC is sintered in a plating bath. By doing so, a plating layer 224, i.e. a connector, is formed between the first and second seed metal layers 116 and 216. The plating bath may contain nickel, copper or an alloy of these materials. Moreover, the plating may be electroless plating, in which case the plating layer may be an electroless plating layer.

Subsequently, a sealing layer 230 is formed to cover the plating layer 224. Thus, the plating layer 224 is shielded by the sealing layer 230 from physical impact, humidity, electrical interference, etc.

Figure 4E:
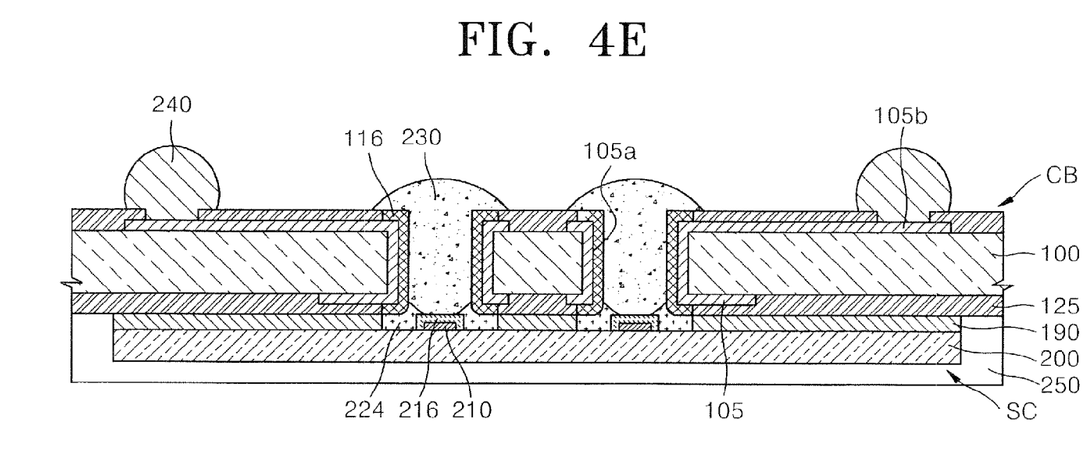

Referring to FIG. 4E, as described with reference to FIG. 1E, a molding member 250 and a solder ball 240 are formed to complete the semiconductor package.

As described above, a conductive film pattern is formed on a sidewall of a throughole and connected to a bond pad of a semiconductor chip via a connector. The connector is formed of conductive particles, a reflown low melting point metal film or a plated film formed within the throughole. Therefore, a circuit board size can be greatly decreased, and in turn, a package dimension can be minimized. Furthermore, no gold wires are needed, which decreases the fabrication cost. Finally, a sealing layer is formed on the connector to shield the connector from physical impact, humidity or electrical interference.

According to an aspect of the present invention, there is provided a semiconductor package including a semiconductor chip and a circuit board. The semiconductor chip has a bond pad. The circuit board has a base substrate with a throughole, and a conductive film pattern placed on a sidewall of the throughole. The throughole is aligned with the bond pad to expose the bond pad. A connector located within the throughole electrically connects the conductive film pattern to the bond pad. A sealing layer covers the connector.

According to another aspect of the present invention, there is provided a method of fabricating a semiconductor package. After providing a circuit board having a base substrate with a throughole and a conductive film pattern placed on a sidewall of the throughole, a semiconductor chip having a bond pad is provided. By aligning the circuit board and the semiconductor chip, the throughole is aligned with the bond pad, exposing the bond pad within the throughole. A connector is formed between the conductive film pattern and the bond pad to electrically connect the conductive film pattern to the bond pad. Then, a sealing layer is formed to cover the connector.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A semiconductor package comprising:
   a semiconductor chip having a bond pad;
   a circuit board having a base substrate with a throughole and a conductive film pattern disposed on a sidewall of the throughole, wherein the throughole exposes the bond pad;
   a connector disposed within the throughole, and electrically connecting the conductive film pattern to the bond pad, wherein a first portion of the connector is disposed within the throughole and contacts the bond pad and wherein a second portion of the connector is disposed within the throughole and contacts the conductive film pattern; and
   a sealing layer covering the connector,
   wherein the connector comprises a conductive particle.

2. The semiconductor package of claim 1, wherein the conductive particle comprises solder, silver (Ag), nickel (Ni) or lead (Pb).

3. The semiconductor package of claim 1, wherein the conductive particle is disposed on a lower portion of the throughole; and the throughole is filled with the sealing layer.

4. The semiconductor package of claim 1, wherein the conductive film pattern comprises a solder ball land disposed on a surface of the base substrate.

5. The semiconductor package of claim 1, wherein the conductive film pattern covers the sidewall of the throughole.

6. The semiconductor package of claim 5, wherein the connector is disposed between the conductive film pattern on the lower sidewall of the throughole and the bond pad.

7. A semiconductor package comprising:
   a semiconductor chip having a bond pad;
   a circuit board having a base substrate with a throughole and a conductive film pattern disposed on a sidewall of the throughole, wherein the throughole is aligned with the bond pad and exposes the bond pad;
   a connector disposed within the throughole, and electrically connecting the conductive film pattern to the bond pad, wherein the connector comprises a conductive particle; and
   a sealing layer covering the connector.

* * * * *